United States Patent [19]
Hayashi

[11] Patent Number: 6,078,516
[45] Date of Patent: Jun. 20, 2000

[54] FERROELECTRIC MEMORY

[75] Inventor: Hideki Hayashi, Kyoto, Japan

[73] Assignee: Rohm Co., Ltd., Kyoto, Japan

[21] Appl. No.: 09/048,999

[22] Filed: Mar. 27, 1998

[30] Foreign Application Priority Data

Mar. 28, 1997 [JP] Japan .................................. 9-076782

[51] Int. Cl.$^7$ .................................................. G11C 11/22
[52] U.S. Cl. ............................................ 365/145; 365/236
[58] Field of Search ..................................... 365/145, 236

[56] References Cited

U.S. PATENT DOCUMENTS 5,815,430  9/1998  Verhaeghe et al. ..................... 365/145

*Primary Examiner*—David Nelms
*Assistant Examiner*—M. Tran
*Attorney, Agent, or Firm*—Arent, Fox Kintner Plotkin & Kahn

[57] ABSTRACT

A memory device has a ferroelectric memory cell block, which is connected via an input/output latch buffer to a data input terminal. The memory device also has a writing period forming circuit that forms a predetermined number of writing periods when writing of data is requested. During the thus formed plurality of writing periods, a control circuit controls the input/output latch buffer to write data to the memory cell block. Thus, a single request for writing of data causes writing of data to be repeated a plurality of times automatically.

3 Claims, 3 Drawing Sheets

FERROELECTRIC MEMORY

BACKGROUND OF THE INVENTION

1. Field of the Invention

The present invention relates to a nonvolatile ferroelectric memory.

2. Description of the Prior Art

A ferroelectric memory is a nonvolatile memory and therefore retains the data stored therein even when it is not receiving electric power. A ferroelectric memory requires rewriting of data after reading of data, because a read operation destroys the data stored in a ferroelectric memory. Inconveniently, a conventional ferroelectric memory, when left in a high-temperature environment for a long time after the writing of data, changes its characteristics in such a way that data that is inverted as compared with the originally stored data is more difficult to write in than other data. This is due to a property of the ferroelectric material used.

This property of a ferroelectric material is called "imprinting". Thus, although a ferroelectric material has the advantage of enduring an extremely large number of times of rewriting, it also has the disadvantage of such imprinting. As a result, ferroelectric memories, which are prone to data errors after long-time use, have conventionally been regarded as rather unreliable.

SUMMARY OF THE INVENTION

An object of the present invention is to provide a ferroelectric memory that reduces the degree to which the writing of data becomes more difficult as a result of imprinting and that thus permits the writing of inverted data.

To achieve the above object, according to the present invention, a ferroelectric memory that writes and reads data to and from a memory cell block made of a ferroelectric material is provided with a counter for counting how many times writing of data has been performed; and a control circuit for performing writing of data in response to a signal that requests writing of data. In this ferroelectric memory, the control circuit performs writing of data a predetermined number of times by use of the counter.

Having the construction as described above, this ferroelectric memory performs writing of data in response to a signal requesting writing of data. Subsequently, the ferroelectric memory repeats writing of data several times at predetermined time intervals, for example, by use of a timer, and counts, by use of a counter, how many times writing of data has been performed. In this way, the ferroelectric memory repeats writing of data a predetermined times. As a result, this ferroelectric memory repeats writing of data a plurality of times automatically in response to a single occurrence of a signal requesting writing of data.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

First Embodiment

Figure 1:
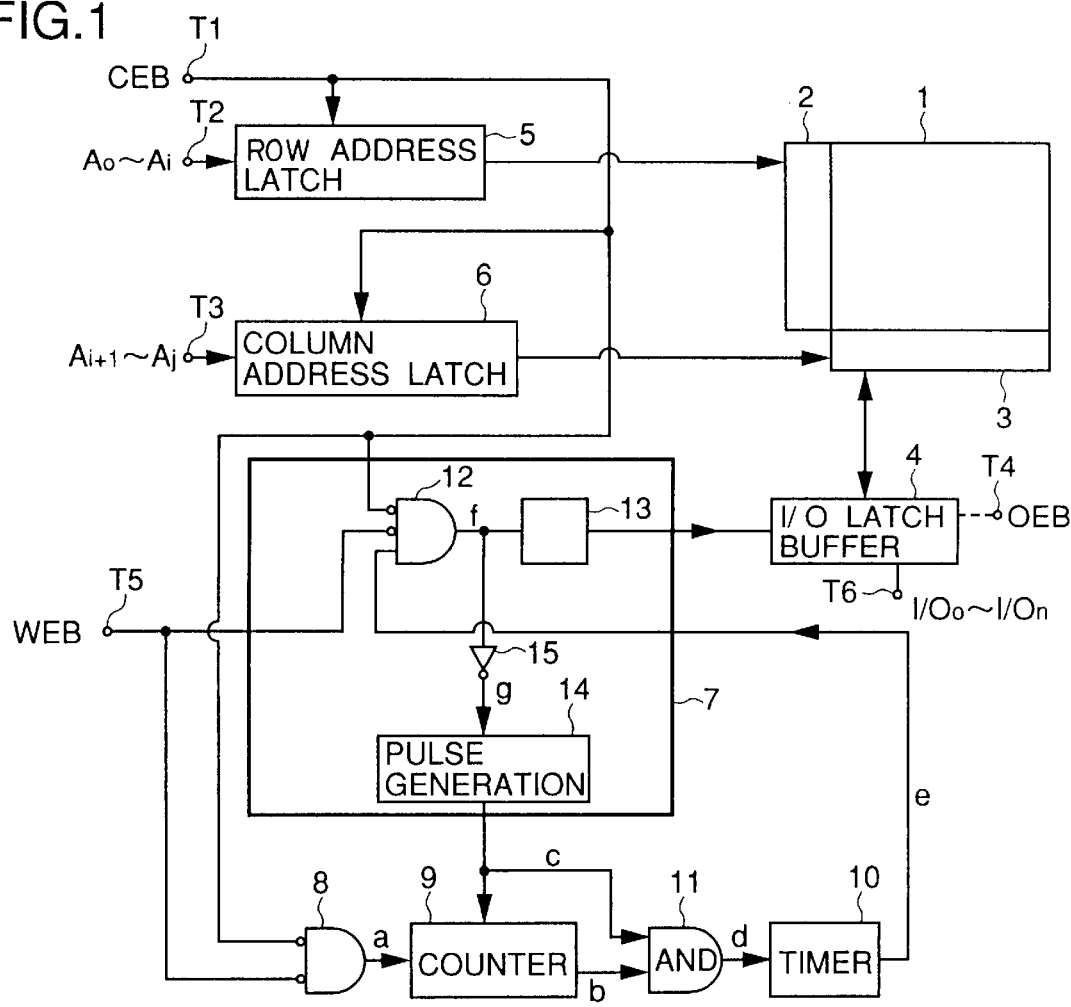
FIG. 1 is a block diagram of the ferroelectric memory of a first embodiment of the present invention.

A first embodiment of the present invention will be described. FIG. 1 shows a block diagram of the ferroelectric memory of the first embodiment that deals with parallel data. This ferroelectric memory is provided with a chip enable (CEB) terminal T1, a row address ($A_o$ to $A_i$) terminal T2, a column address ($A_{i+1}$ to $A_j$) terminal T3, an output enable (OEB) terminal T4, a write enable (WEB) terminal T5, and a data ($I/O_o$ to $I/O_n$) input/output terminal T6.

The row address bits $A_o$ to $A_i$ are stored temporarily in a row address latch circuit 5; the column address bits $A_{i+1}$ to $A_j$ are stored temporarily in a column address latch circuit 6. The output enable bit OEB is fed to an I/O latch buffer 4; the write enable bit WEB is fed to a control circuit 7.

The input/output terminal T6 for data $I/O_o$ to $I/O_n$ is connected to the I/O latch buffer 4, so that input or output data is temporarily stored in the I/O latch buffer 4. The chip enable bit CEB is fed to the row address latch circuit 5, to the column address latch circuit 6, and to the control circuit 7.

This ferroelectric memory starts an operation for writing or reading data at a trailing edge of the chip enable bit CEB. Specifically, at a trailing edge of the chip enable bit CEB, the row address latch circuit 5 and the column address latch circuit 6 latch the bits of their respective addresses. Simultaneously, the control circuit 7 performs an operation to update the data stored in the I/O latch buffer 4.

Then, the row address bits latched in the row address latch circuit 5 are transferred to a row address decoder 2; the column address bits latched in the column address latch circuit 6 are transferred to a column address decoder 3. This causes the row address decoder 2 and the column address decoder 3 to point to one particular memory cell within a memory cell block 1. Writing or reading of data is performed on the thus specified particular memory cell.

When the write enable bit WEB is low, writing of data is performed from the I/O latch buffer 4 to the memory cell block 1; when the write enable bit WEB is high, reading of data is performed. Note that, when a trailing edge of the write enable bit WEB occurs earlier than a trailing edge of the chip enable bit CEB, the trailing edge of the write enable bit WEB causes the I/O latch buffer 4 to retain the data.

The output enable bit OEB is used to control the output of the read-out data; specifically, when it is low, the data stored in the I/O latch buffer 4 is transferred to the input/output terminal T6 for data $I/O_o$ to $I/O_n$, and, when it is high, the data is not transferred for output.

After a read operation as described above, the ferroelectric memory needs to write the read-out data back to the same memory cell again. The latch circuits 5 and 6 are provided to this end.

Figure 4:
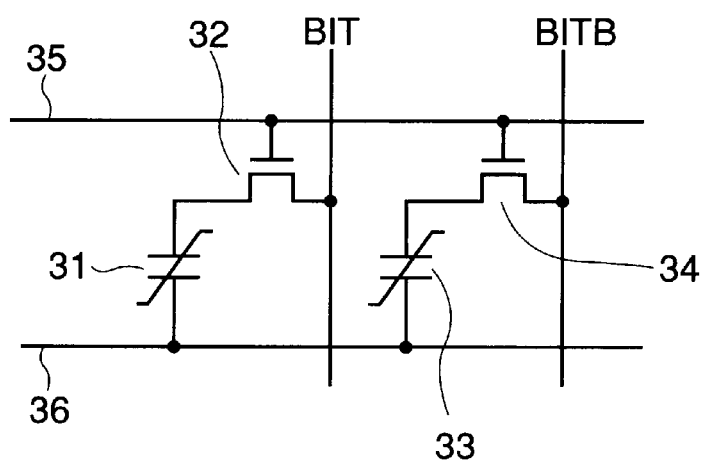
FIG. 4 is a circuit diagram of the memory cell that corresponds to one bit.

FIG. 4 shows a circuit diagram of the memory cell constituting a part of the memory cell block 1 that corresponds to one bit. This memory cell is of a 2T2C type (i.e. the type that is composed of two transistors and two capacitors), and is therefore composed of two transistors 32 and 34 and two ferroelectric capacitors 31 and 33. The ferroelectric capacitors 31 and 33 are capacitors that have a ferroelectric material sandwiched between electrodes.

More specifically, each memory cell is constructed and operates as follows. To a word line 35, the gates of field-effect transistors 32 and 34 are connected. The transistors 32 and 34 both perform switching operations. The transistor 32 has one of its source and drain connected to a bit line BIT and has the other connected to one electrode of the ferroelectric capacitor 31. The other electrode of the ferroelectric capacitor 31 is connected to a plate line 36. The transistor 34 has one of its source and drain connected to another bit line BITB and has the other connected to one electrode of the ferroelectric capacitor 33. The other electrode of the ferroelectric capacitor 33 is connected to the plate line 36.

The two bit lines BIT and BITB carry signals that are inverted with respect to each other. At a trailing edge of the signal that is fed to the chip enable (CEB) terminal T1, a pulse is applied to the plate line 36. At this time, operations including inversion of the polarization state of the ferroelectric material are performed, and thereby writing of data is achieved. On the other hand, by comparing the voltages across the capacitors 31 and 33 after the application of the pulse, reading of data is achieved. After reading of data, re-writing is required because a read operation destroys the stored data.

Next, how writing of data is controlled will be described. In FIG. 1, numeral 8 represents a write-operation detecting circuit that receives the chip enable bit CEB and the write enable bit WEB and that, when both of these two bits CEB and WEB are low, outputs a high level and thereby activates a counter 9 provided in the succeeding stage. The counter 9 is reset in synchronism with a rising edge of a detection signal fed from the write-operation detecting circuit 8, and has a target count value N preset in it. Assume here that the target count value N is 3, for example. The counter 9 counts the pulses fed from a pulse generating circuit 14 provided in the control circuit 7. The counter 9, when reset, outputs a high level, and, when the actual count reaches N, drops its output to a low level.

Numeral 11 represents an AND gate that receives the output of the counter 9 and the pulses from the pulse generating circuit 14. Numeral 10 represents a timer for delaying the pulses fed from the AND gate 11, and its output is fed to an AND gate 12 provided in the control circuit 7. The AND gate 12 also receives the chip enable bit CEB and the write enable bit WEB, though these two bits are inverted before being subjected to a logical AND operation with the output of the timer 10. Numeral 15 represents an inverter that inverts the output of the AND gate 12 before it is fed to the pulse generating circuit 14. The pulse generating circuit 14 is active when it is receiving a high level from the inverter 15, and is inactive when it is receiving a low level. Numeral 13 represents a controller that activates the I/O latch buffer 4 (thereby to achieve writing of data to the memory cell block 1) when the AND gate 12 outputs a high level.

Figure 2:
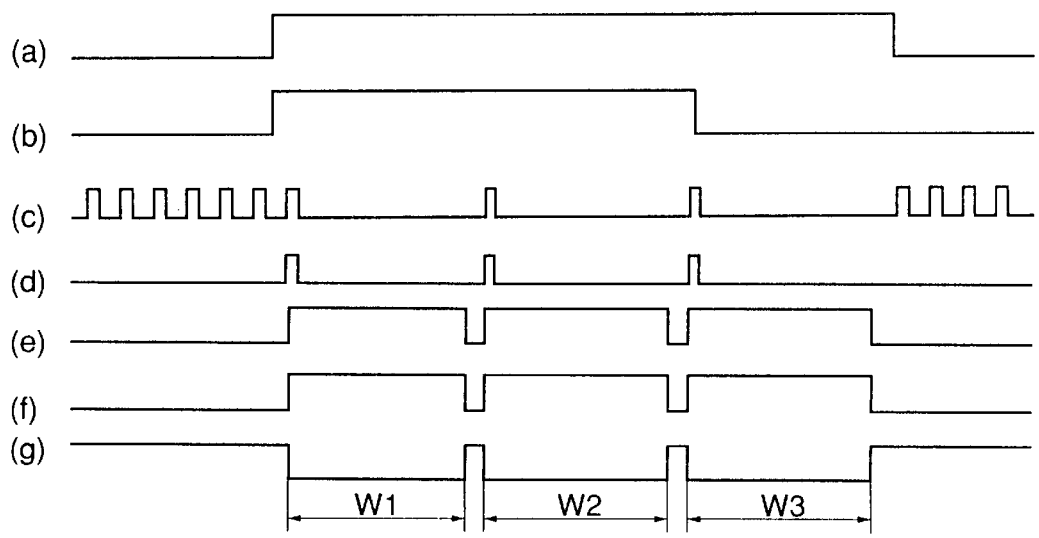
FIG. 2 is a diagram showing the waveforms observed at various points in the ferroelectric memory of the first embodiment.

FIG. 2 shows the waveforms observed at some relevant points in the circuit of FIG. 1. In FIGS. 1 and 2, the letter a indicates the output of the write-operation detecting circuit, the letter b indicates the output of the counter 9, the letter c indicates the pulses outputted from the pulse generating circuit 14, the letter d indicates the output of the AND gate 11, the letter e indicates the output of the timer 10, the letter f indicates the output of the AND gate 12, and the letter g indicates the output of the inverter 15.

The write-operation detecting circuit 8 calculates a logical AND between a logical NOT of the write enable bit WEB and a logical NOT of the chip enable bit CEB. When both the write enable bit WEB and the chip enable bit CEB are low, the write-operation detecting circuit 8 outputs a high level and thereby resets the counter 9 so that the counter 9 is brought into a ready-to-operate state. At this time, the output e of the timer is still low, and accordingly the output f of the AND gate 12 is also low, and the output g of the inverter 15 is high, with the result that the pulse generating circuit 14 is generating pulses. When the counter 9 is reset, it raises its output to a high level, and thereby causes the pulses c to be fed through the AND gate to the timer 10. Then, the output e of the timer 10 becomes high, the output f of the AND gate 12 also becomes high, and the controller 13 turns on the I/O latch buffer 4. As a result, writing of data is started. During writing of data, the pulse generating circuit 14 remains inactive and thus does not generate any pulse.

The timer 10 holds its output e high for a period W1 of 200 to 300 nanoseconds, for example. After the lapse of this period W1, the timer 10 drops its output e to a low level and thereby deactivates the controller 13. On the other hand, the pulse generating circuit 14 generates a pulse. By delaying this pulse, the timer 10 produces another period W2 during which writing of data is performed for the second time. Subsequently, in a similar manner, writing of data is performed for the third time during still another period W3. When the counter 9 has received and counted three pulses, it drops its output to a low level, so that writing of data is not performed for the fourth time.

In this way, the control circuit 7, by use of the counter 9, the timer 10, and other components, repeats writing of data a predetermined number of times (in this example, three times). In other words, in response to a single request for writing of data, a write operation is repeated a plurality of times for a single set of data.

As a result, the ferroelectric memory automatically repeats a write operation a plurality of times simply by being fed from outside with a single, instead of more than one, request for writing of data. It should be noted however that, since the ferroelectric memory cannot proceed to subsequent operations while it is performing such write operations, there is a possibility that the interval from one operation sequence to the next (i.e. the cycle time) is unduly prolonged.

As described above, in this embodiment, when writing of data (I/O$_o$ to I/)$_n$) is requested, writing of data to the memory cell block 1 is automatically repeated a plurality of times. It has been experimentally confirmed that a ferroelectric material, even when it has come to exhibit imprinting, provides far higher writing reliability if a write operation is performed repeatedly. Accordingly, the ferroelectric memory of this embodiment does not suffer from degraded reliability even after long-time use.

A ferroelectric material endures an extremely large number of times of rewriting, and therefore repeating a write operation about three times in response to a single data-writing request does not lead to any serious problem. Note that, although the example described above employs a memory cell block 1 having 2T2C-type memory cells as shown in FIG. 4, the construction of this embodiment serves to reduce the effects of imprinting also with a memory cell block having, for example, 1T1C-type memory cells.

The ferroelectric memory of this embodiment can be used in any situation where a nonvolatile memory is used. For example, the ferroelectric memory can be used for the storage of tuning data in the tuner of a television receiver or videocassette recorder, and for the storage of abbreviated dialing data in a telephone set. It is also possible to apply the ferroelectric memory of this embodiment to an IC (integrated circuit) having a nonvolatile memory in it.

The timer 10 may be realized by use of a delay circuit of any other type as long as it can produce a predetermined length of delay time.

Second Embodiment

Figure 3:
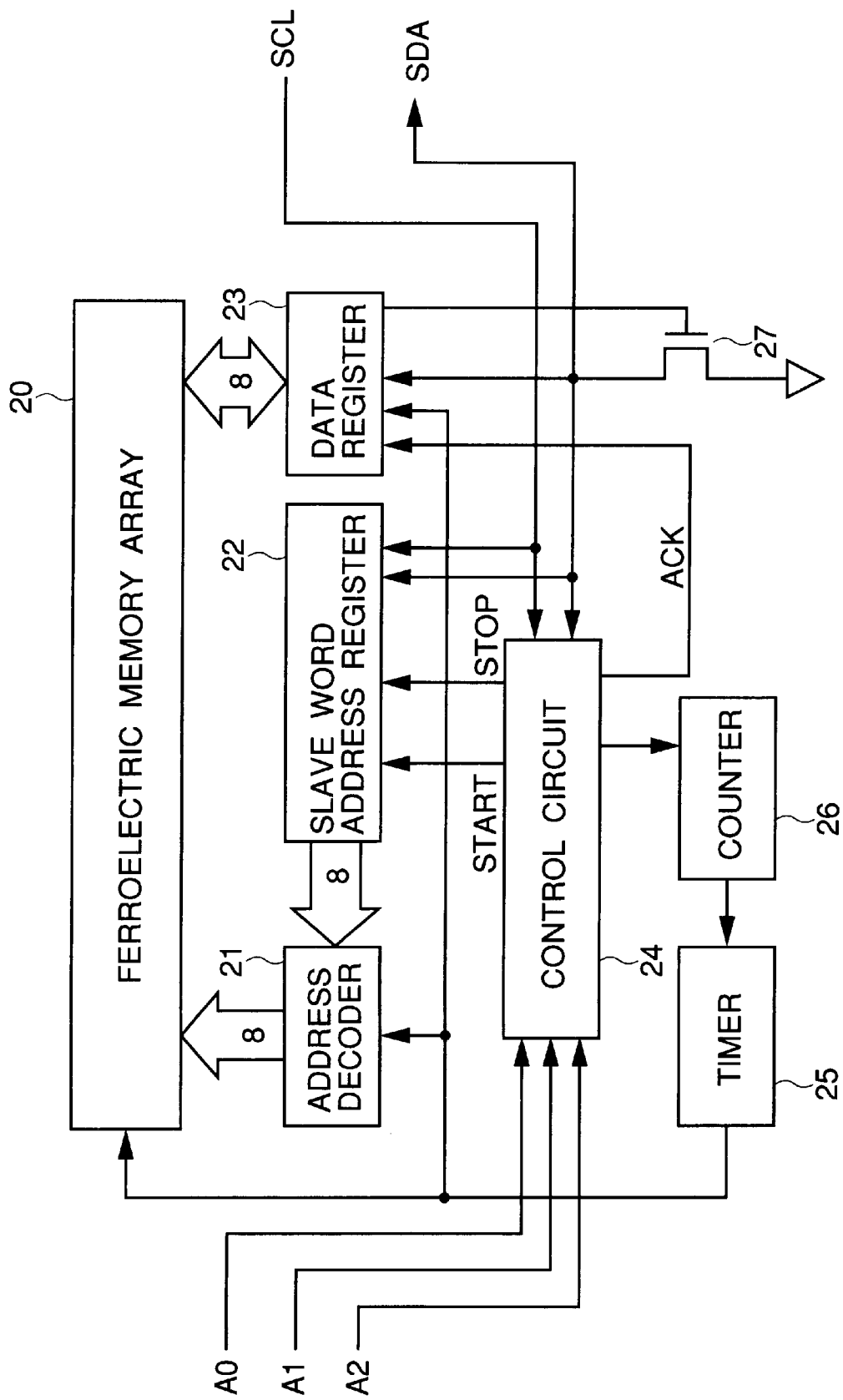
FIG. 3 is a block diagram of the ferroelectric memory of a second embodiment of the present invention.

A second embodiment of the present invention will be described. FIG. 3 shows a block diagram of the ferroelectric memory of the second embodiment that deals with serial data. This ferroelectric memory is provided with a serial clock (SCL) input terminal, a serial data address (SDA) input/output terminal, and device address ($A_0$ to $A_2$) input terminals. The ferroelectric memory operates in synchronism with the serial clock (SCL).

The serial data address (SDA) is a signal that contains addresses, data, and others, and is transferred serially and bidirectionally. The device addresses ($A_0$ to $A_2$) are provided to extend the range of addresses so that a plurality of ferroelectric memories of the same type can be distinguished from each other even when they are connected to a single bus. The serial clock (SCL), the serial data address (SDA), and the device addresses ($A_0$ to $A_2$) are fed to a control circuit 24.

The serial data address (SDA) carries a slave word address. A slave word address consists of device addresses ($A_0$ to $A_2$), a code specifying either a write or read operation, addresses, and other items, and is stored in a slave word address register 22. In the case of a write operation, after the above addresses and other items comes data. This data is temporarily stored in the data register 23.

An eight-bit signal from the slave word address register 22 causes an address decoder 21 to point to one specific memory cell within a ferroelectric memory array (memory cell block) 20, and the data held in the data register 23 is written in to that particular memory cell. In this embodiment, writing and reading of data is performed eight bits at a time (one byte at a time). Subsequently, the control circuit 24 activates a counter 26.

The counter 26 is a decrementing counter, for example. A signal from the counter 26 is, after being delayed by a timer 25, fed to the ferroelectric memory array 20, to the address decoder 21, and to the data register 23. This causes writing of data to be achieved. Then, the control circuit 24 feeds a signal to the counter 26. In this way, the ferroelectric memory repeats a write operation a predetermined number of times.

In the case of a read operation, data is read out from the array 20 by use of the slave word address register and is stored in the data register 23. Then, a field-effect transistor 27 is turned on and off in an appropriate manner so that the readout data is sent out as the data of the serial data address (SDA). The field-effect transistor 27 has its gate connected to the data register 23. The field-effect transistor 27 has one of its source and drain connected to a constant voltage such as the ground level and has the other connected to the signal line of the serial data address (SDA) and to the data register 23.

The control circuit 24 also sends a start signal and a stop signal to the slave word address register 22 to inform it of the starting and ending, respectively, of an operation. Moreover, when the control circuit 24 receives addresses or data, it sends an acknowledgment signal (ACK) to the data register 23.

As described above, in this embodiment, when the data carried by the serial data address (SDA) is written in to the ferroelectric memory array 20, a write operation is repeated a predetermined number of times at predetermined time intervals by use of the counter 26. As a result, it is possible to perform writing of data securely even with a ferroelectric material that has come to exhibit imprinting. The memory array 20 has, for example, 2T2C-type or 1T1C-type memory cells.

Usually, the clock period of the serial clock (SCL) is on the order of microseconds, whereas the time period that is produced by the timer 25 is 200 to 300 nanoseconds. Accordingly, as long as a write operation is repeated about three times, the ferroelectric memory can complete write operations within a single period of the serial clock (SCL), and thus the repetition of a write operation does not adversely affect the cycle time or other.

As described heretofore, according to the present invention, in a ferroelectric memory, when writing of data is performed, a write operation is automatically repeated several times for a single set of data. This makes it possible to prevent the degradation of the characteristics of the ferroelectric material due to imprinting, and thus to perform writing of data securely. As a result, it is possible to improve the reliability of the ferroelectric memory after long-time use. In addition, since the necessary operations are performed automatically in the ferroelectric memory, it is not necessary to externally perform extra operations.

What is claimed is:

1. A memory device comprising:

a ferroelectric memory cell block;

a data input terminal;

an input/output latch buffer connected to both said ferroelectric memory cell block and said data input terminal;

detecting means for detecting a request for writing of data;

writing period forming means for forming, in response to a request for writing of data, a plurality of writing periods to repeat writing of data a predetermined number of times; and control means for controlling said input/output latch buffer to write data to said memory cell block during the plurality of writing periods formed by said writing period forming means, wherein said writing period forming means includes
   a pulse generating circuit,
   a counter for counting output pulses of said pulse generating circuit, said counter using, as a target count, a value equal to the predetermined number of times that writing of data is repeated, and
   a writing period forming circuit for forming a writing period every time said counter counts.

2. A memory device as claimed in claim 1, wherein said writing period forming circuit is a timer that operates in response to the pulses that are counted by said counter.

3. A memory device as claimed in claim 2, wherein the request for writing of data is represented by a write enable bit and a chip enable bit.

* * * * *